United States Patent [19]
Lautzenhiser et al.

[11] Patent Number: 5,910,334
[45] Date of Patent: Jun. 8, 1999

[54] METHOD OF MANUFACTURE FOR A THICK FILM MULTI-LAYER CIRCUIT

[75] Inventors: Frans Peter Lautzenhiser, Noblesville; John Karl Isenberg, Rossville; James Edward Walsh, W. Lafayette; Adam Wade Schubring, Kokomo, all of Ind.

[73] Assignee: Delco Electronics Corporation, Kokomo, Ind.

[21] Appl. No.: 08/991,685

[22] Filed: Dec. 16, 1997

[51] Int. Cl.$^6$ ........................................................ B05D 5/12
[52] U.S. Cl. ............................ 427/96; 427/258; 427/384; 427/402
[58] Field of Search ............................... 427/96, 258, 384, 427/402

*Primary Examiner*—Brian K. Talbot
*Attorney, Agent, or Firm*—Jimmy L. Funke

[57] ABSTRACT

An improved method of manufacturing multi-layer thick film circuits that effectively eliminates the trade-off between thickness and definition, permitting dielectric layers of increased thickness with no pin-holes, and at the same time, more precise definition of dielectric features, such as via openings and solder stops. The dielectric features are precisely defined by an initial thin layer of dielectric material, referred to as a feature definition print, or FDP. After the FDP has been dried but not yet fired, a via can be formed by printing a comparatively thick cover layer of dielectric, over-lapping the edges of the FDP. Due to the porous nature of the dried but not fired FDP, it absorbs solvent from the dielectric cover layer, which inhibits the spreading of the dielectric cover layer. The FDP is then co-fired with the first dielectric layer, and a second dielectric layer may be provided atop the fired first layer to further increase the overall dielectric thickness, if so desired. This results in a thicker dielectric layer for the same number of successive printing steps, and at the same time, smaller dielectric features. The thicker dielectric layer provides improved isolation between circuit layers, and the smaller dielectric features increase the available surface area for conductors and components on the upper dielectric layer. Additionally, process robustness is improved, since there is less fine tuning and batch-to-batch variation when used in high volume production.

13 Claims, 6 Drawing Sheets

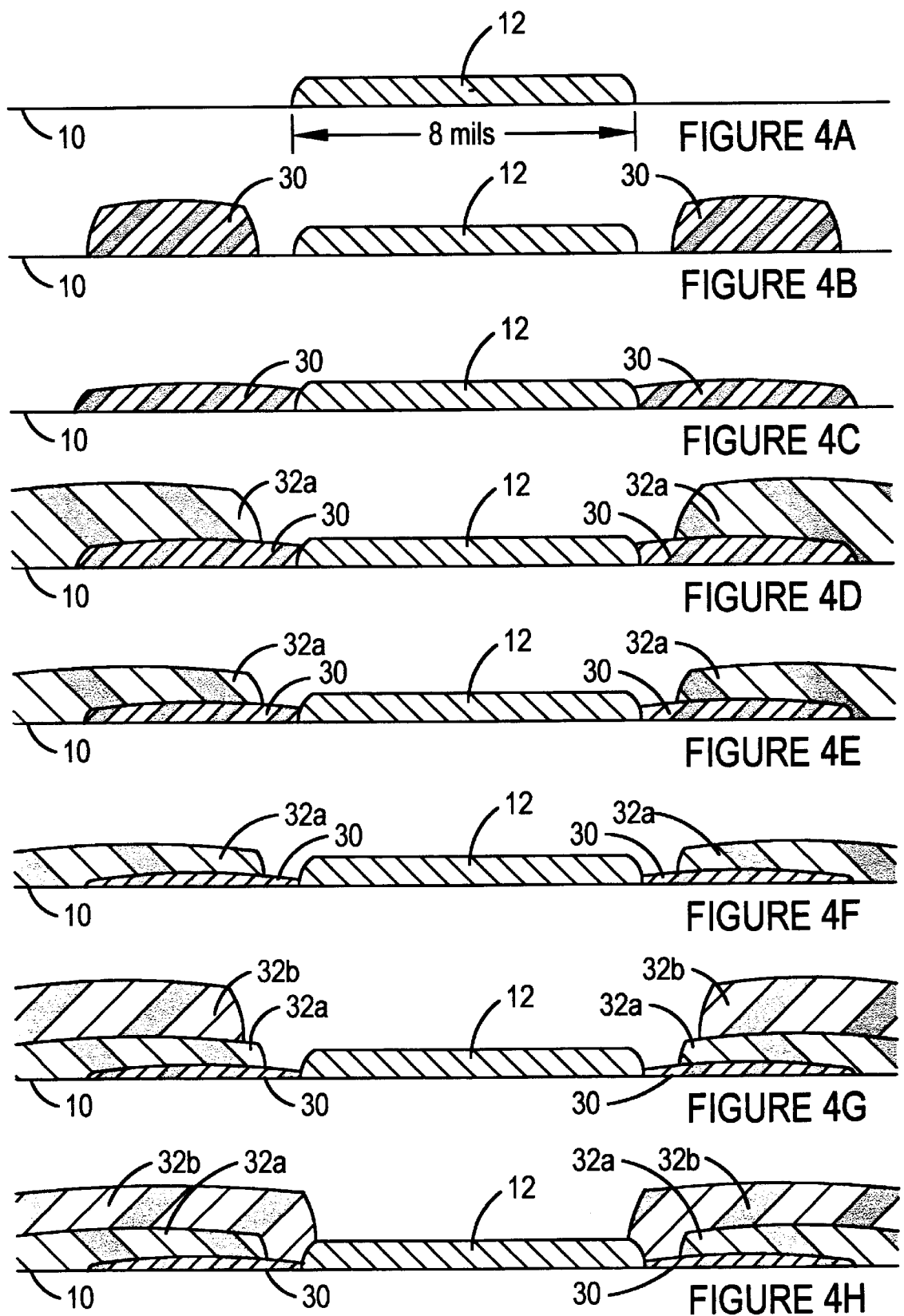

METHOD OF MANUFACTURE FOR A THICK FILM MULTI-LAYER CIRCUIT

This invention relates to the manufacture of multi-layer thick film circuits, and more particularly to a method of making circuits having thick dielectric layers and precisely defined dielectric features.

BACKGROUND OF THE INVENTION

In the manufacture of multi-layer thick film circuits, successive layers of circuitry comprising conductors and components are electrically and physically isolated from one another by one or more intervening layers of dielectric material. To provide adequate isolation, the dielectric layer must be fairly thick, particularly where the top circuit layer includes components that are designed to be laser trimmed. Printing a thick dielectric layer is also desirable for process considerations, as thinner prints are prone to the formation of undesirable pin-holes, and such pin-holes are prone to propagate through successive layers of thin dielectric prints. However, thick layers of dielectric are problematic because they tend to spread beyond the intended print pattern, reducing the definition of dielectric features such as via openings and solder stops. Although dielectric formulations can be modified to reduce spreading, this also tends to produce pin-holes in the resulting dielectric layer. Consequently, circuit designers must contend with an engineering tradeoff between print thickness and feature definition. In a typical design compromise, the dielectric is printed at less than the desired thickness, and the via openings are enlarged and the solder stops are pulled back to accommodate a certain amount of dielectric layer spreading. Increased dielectric thickness is then achieved by printing one or more additional dielectric layers atop the initial dielectric layer. Obviously, this design approach is not particularly desirable, since extra large dielectric features limit circuit density on the upper dielectric layer, thin printing layers are prone to pin-holing, and extra printing and firing steps increase cost and reduce manufacturing throughput.

SUMMARY OF THE PRESENT INVENTION

The present invention is directed to an improved method of manufacturing multiple layer thick film circuits that effectively eliminates the trade-off between thickness and definition, permitting dielectric layers of increased thickness with no pin-holes, and at the same time, more precise definition of dielectric features, such as via openings and solder stops.

According to the invention, the dielectric features are precisely defined by an initial thin layer of dielectric material, referred to herein as a feature definition print, or FDP. After the FDP has been dried but not yet fired, a via can be formed by printing a comparatively thick cover layer of dielectric on the first circuit layer, and partially over-lapping the FDP. Due to the porous nature of the dried but not fired FDP, it absorbs solvent from the subsequent dielectric cover layer, which inhibits the spreading of the dielectric cover layer. The FDP is then co-fired with the first dielectric layer, and a second dielectric layer is typically printed atop the fired first layer to achieve the desired overall dielectric thickness.

When compared with circuits manufactured using conventional processes, a circuit manufactured according to the method of this invention has a thicker dielectric, and at the same time, smaller and better defined dielectric features. The thicker dielectric layer provides improved isolation between circuit layers, as discussed above, and the smaller dielectric features increase the available surface area for conductors and components on the upper dielectric layer. From a process standpoint, the above-described manufacturing method is more robust, in that there is less fine tuning and batch-to-batch variation when used in high volume production.

BRIEF DESCRIPTION OF THE DRAWINGS

FIGS. 4A, 4C, 4D, 4E, 4F, 4G and 4H depict in cross-section a method of manufacturing a via in a thick film circuit according to this invention.

DETAILED DESCRIPTION OF THE DRAWINGS

Figure 1A:
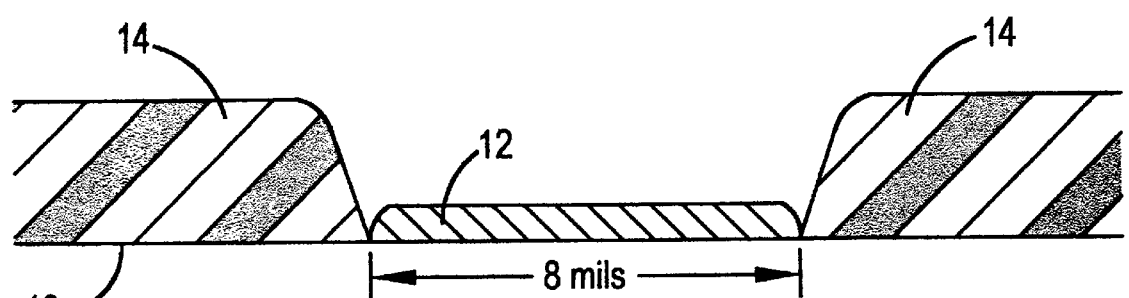
FIGS. 1A and 1B depict in cross-section an ideal method of manufacturing a via in a thick film circuit.

Various approaches to forming dielectric features in a multi-layer thick film circuit are shown in FIGS. 1–6. In each case, the reference numeral 10 designates the surface 10 of a ceramic substrate, and the reference numeral 12 designates a thick film conductor that has been printed, dried and fired, forming a portion of a first circuit layer on the substrate surface 10. For convenience, the vertical scale in the cross-section diagrams of FIGS. 1–4 and 6 has been exaggerated by a factor of approximately two, compared to the horizontal scale.

FIGS. 1–2 and 4–5 depict various manufacturing processes for forming vias in a dielectric layer formed intermediate the first circuit layer and a second circuit layer formed later in the manufacturing process. In general, the dielectric layer provides mechanical and electrical isolation between the first and second circuit layers, and the vias are used to electrically interconnect the first and second circuit layers.

Figure 1B:
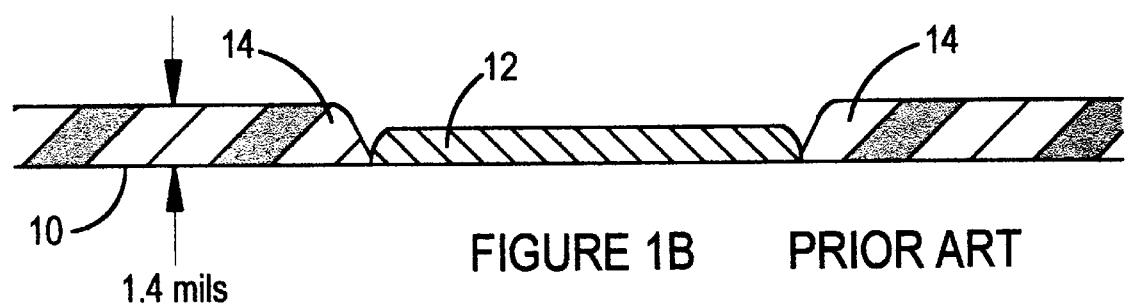

In general, dielectric layers are formed by two or more successive printing steps to minimize the likelihood of a circuit defect due to processing flaws. In an ideal process with ideal materials, the formation of the first dielectric layer is depicted in FIGS. 1A–1B. In such case, the dielectric layer 14 would be spaced very close to conductor 12 as shown in FIG. 1A, or possibly even overlap it to some extent. During drying, the dielectric layer 14 shrinks to about 50% of its printed thickness as the solvent evaporates, resulting in a dried film of the desired overall thickness, indicated in FIG. 1B as approximately 0.0020 in., or 2 mils. Ideally, this would leave a via opening of approximately the same width as the conductor 12, indicated in FIG. 1A as 8 mils. However, the ideal process is impractical because dielectric layers which are printed thick enough to minimize pin-holing tend to spread significantly beyond the intended print pattern. In a worst case situation, the dielectric material can completely cover conductor 12, ruining the via.

Figure 2A:
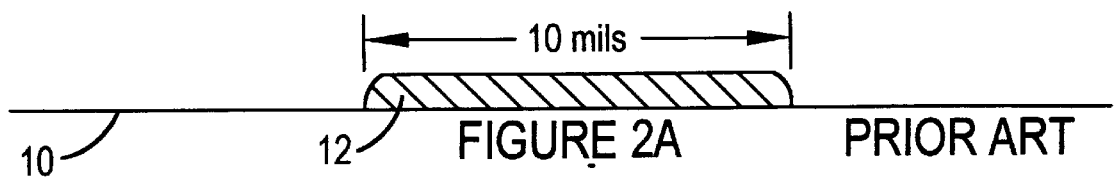
FIGS. 2A, 2B, 2C, 2D, 2E and 2F depict in cross-section a conventional method of manufacture that accommodates for dielectric spreading in the formation of a via in a thick film circuit.
Figure 2B:
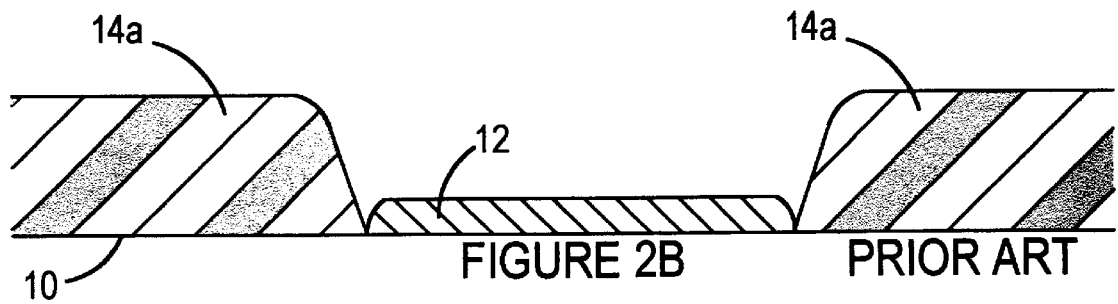
Figure 2C:
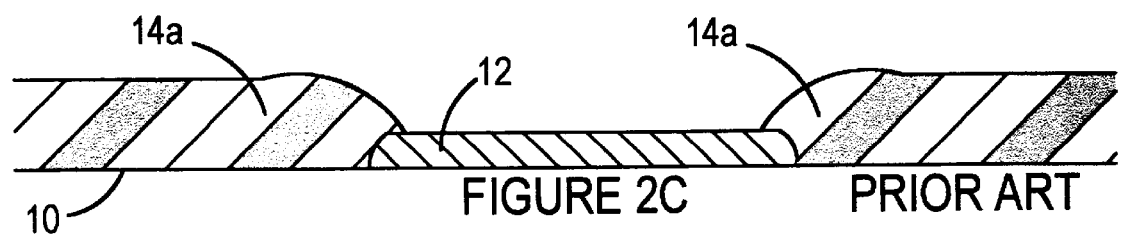
Figure 2D:
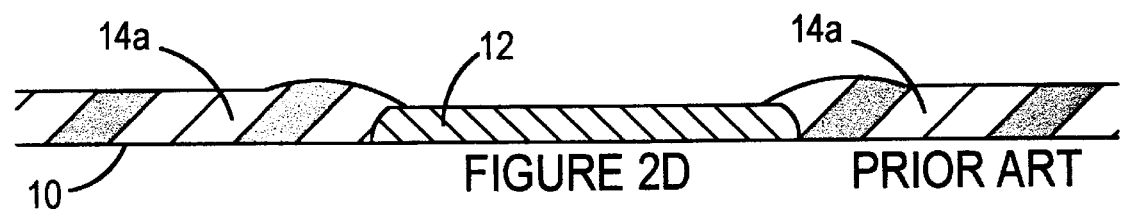
Figure 2E:
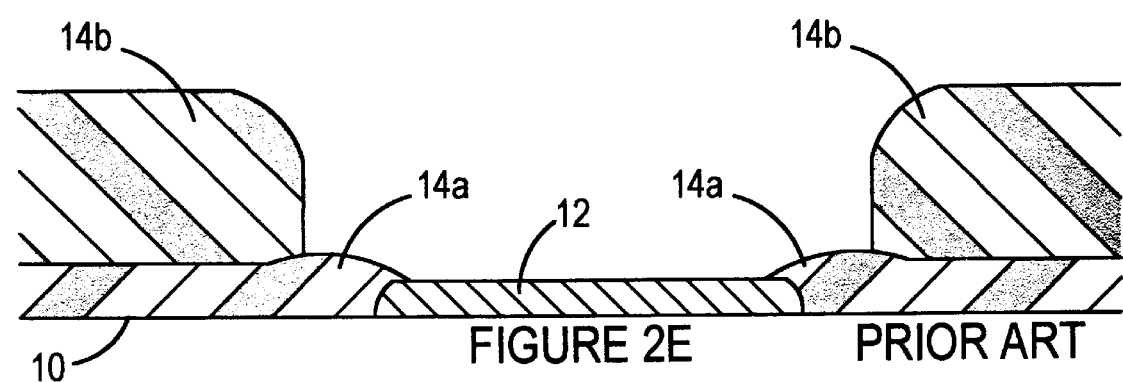
Figure 2F:
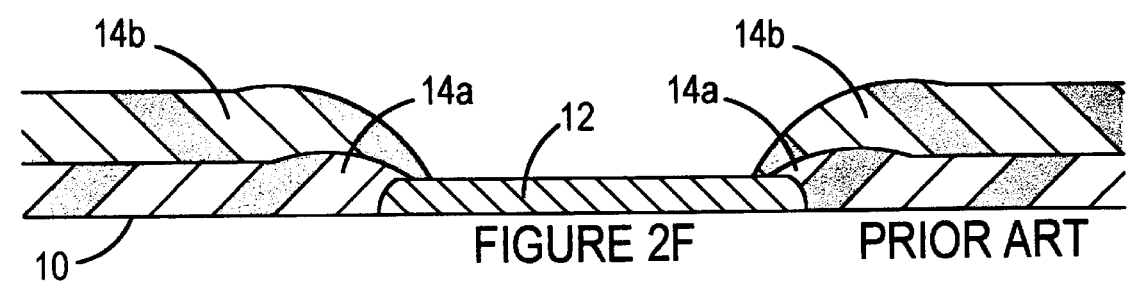

In practical processes, the size of the via is enlarged to accommodate for dielectric spreading, and the dielectric layer 14 is formed by two or more thinner dielectric layers. FIGS. 2A–2F illustrate a practical process in which the via is enlarged and the dielectric layer comprises a first layer 14a and a second layer 14b. As seen in FIG. 2B, the print via of the first dielectric layer 14a is enlarged to approximately 10 mils, and the width of the conductor 12 is enlarged in the vicinity of the via to approximately the same dimension. The dielectric layer 14a experiences some spreading prior to and during drying, and is depicted in the dried state in FIG. 2C. As indicated above, the drying process reduces the thickness of the dielectric by approximately 50%, as illustrated. Subsequent firing of the circuit further reduces the thickness of dielectric layer 14a by approximately 30%, as depicted in FIG. 2D. As seen in FIG. 2E, the print via of the second dielectric layer 14b is enlarged to approximately 14 mils. The print thickness of dielectric layer 14b is approximately equal to that of layer 14a. Prior to and during drying, the layer 14b spreads somewhat as indicated in FIG. 2F, reducing the width of the completed via to about 6 mils, as shown.

Enlarging and staggering the dielectric layers 14a, 14b as shown in FIGS. 2A–2F can effectively accommodate dielectric spreading, but at the expense of taking up additional surface area on upper dielectric layer 14b. Moreover, the width of the vias may need to be increased even further if a third dielectric layer is needed to achieve the desired overall thickness of dielectric. As indicated above, increasing the thickness of the individual dielectric layers to achieve the increased overall thickness only exacerbates the dielectric spreading. Additionally, the amount of dielectric spreading tends to vary with process conditions and material variations, and the feature enlargement must be sufficient to accommodate worst case or near-worst-case conditions.

The above described design approaches illustrate the inherent trade-off between print thickness and feature definition. Thinner dielectric layers provide better feature definition because spreading is reduced, but additional layers and attendant process steps are required to achieve a thick overall dielectric, and pin-holing is more likely. Conversely, thicker dielectric layers achieve a desired overall thickness of dielectric with a minimum number of successive layers, but feature definition suffers due to increased dielectric spreading.

A similar phenomenon is experienced in forming dielectric solder stops, as illustrated in FIGS. 3A–3G. In general, a lateral thick-film conductor 12 formed on the substrate surface 10 is to be soldered to the terminal of an electronic component 20, such as a flip-chip. A solder-stop comprising a layer 24 of dielectric extending laterally across the conductor 12 limits reflow of the solder joint 26 when the component 20 is attached, so as to provide the desired solder connection strength and component stand-off height.

Figure 3A:
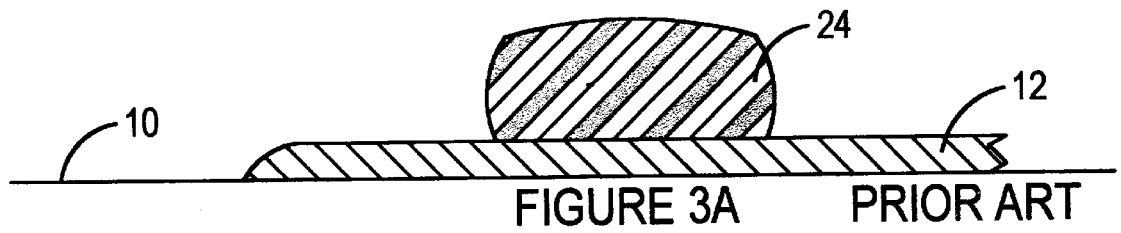
FIGS. 3A, 3B, 3C and 3D depict in cross-section a conventional method of manufacture that accommodates for dielectric spreading in the formation of a solder stop in a thick film circuit.
Figure 3B:
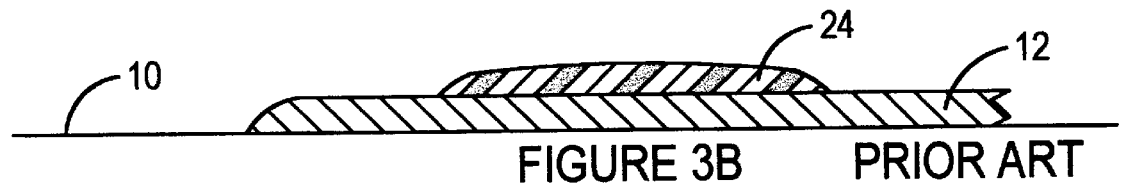
Figure 3C:
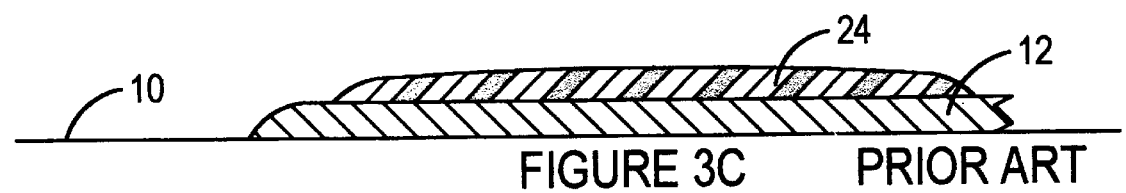
Figure 3D:
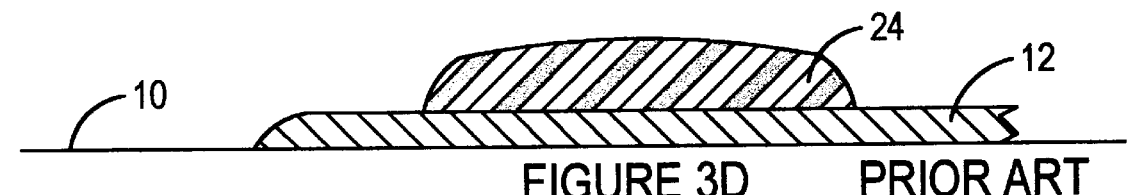
Figure 3E:
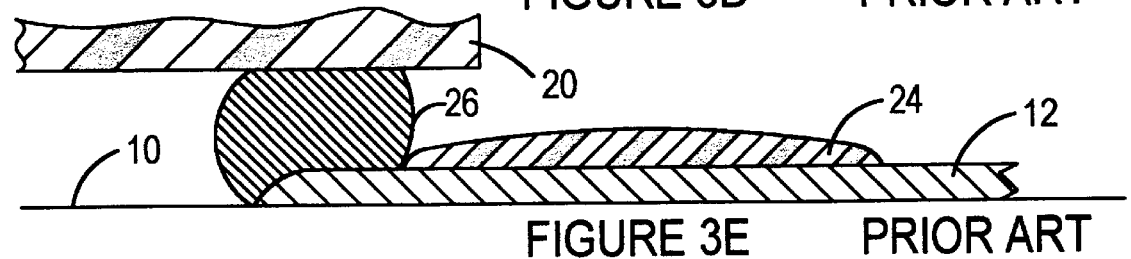
Figure 3F:
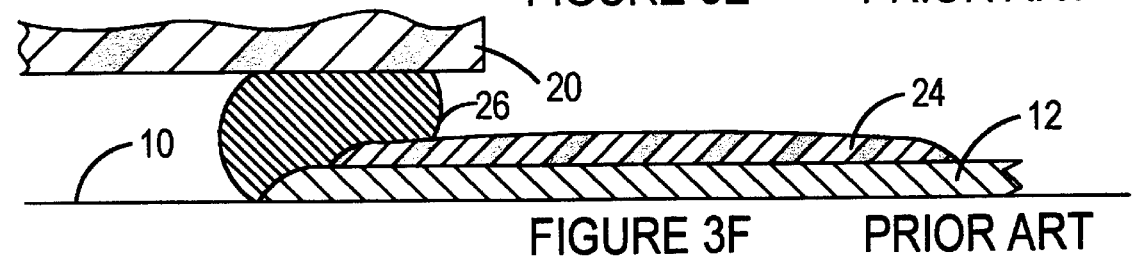
Figure 3G:
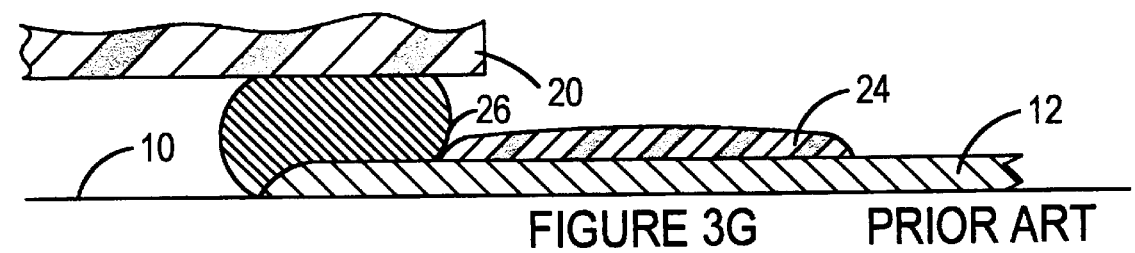

To reduce the number of process steps, the solder-stop layer 24 is typically printed as part of the first dielectric cover layer. Consequently, the solder stop print is relatively thick, as shown in FIG. 3A. Prior to and during drying, the layer 24 spreads out to a variable degree, depending on process and material variations. FIGS. 3B–3D respectively depict nominal spreading, higher than nominal spreading, and lower than nominal spreading. With nominal dielectric spreading, the component 20 is properly soldered to the conductor 12, as illustrated in FIG. 3E; the solder joint 26 has high mechanical strength, and is properly constrained to provide a component stand-off height that facilitates subsequent washing and underfilling processes. With higher then nominal spreading, the exposed area of conductor 14 is too small, and the solder joint 26 is poorly formed, as illustrated in FIG. 3F; the joint 26 in this case makes poor electrical contact and has poor mechanical strength and durability. With lower than nominal spreading, the solder joint spreads out over a large area of conductor 14, as shown in FIG. 3G; in this case, the joint 26 is too thin, and the stand-off height of component 20 is decreased.

The present invention overcomes the above-described disadvantages with an improved method of manufacturing multiple layer thick film circuits that effectively eliminates the trade-off between thickness and feature definition. The method of this invention permits the printing of thicker dielectric layers, while at the same time, allowing more precise definition of dielectric features, such as via openings and solder stops. According to the invention, the dielectric features are precisely defined by an initial thin layer of dielectric material, referred to herein as a feature definition print, or FDP. After the FDP has been dried but not yet fired, a via is formed by printing a comparatively thick cover layer of dielectric paste material on the first circuit layer, and over-lapping the edges of the FDP. In general, dielectric pastes include a liquid medium and a solid medium; the liquid medium comprises a solvent, resins and surfactants, while the solid medium comprises powdered solids. Due to the porous nature of the dried but not fired FDP, it absorbs liquid medium from the dielectric paste forming the cover layer. This reduces the liquid fraction of the paste, thereby increasing the paste viscosity, and inhibiting the spreading of the dielectric cover layer. The FDP is then co-fired with the dielectric cover layer, and a second dielectric cover layer is typically printed atop the fired first layer to achieve the desired overall dielectric thickness. Conveniently, the FDP print is also used to form the solder stops, significantly reducing the process variability due to dielectric spreading illustrated in FIGS. 3A–3G.

When compared with circuits manufactured using conventional processes, a circuit manufactured according to the method of this invention has a thicker dielectric, and at the same time, smaller and better defined dielectric features. The thicker dielectric layer provides improved isolation between circuit layers, as discussed above, and the smaller dielectric features increase the available surface area for conductors and components on the upper dielectric layer. From a process standpoint, the manufacturing method of this invention is more robust, in that there is less fine tuning and batch-to-batch variation when used in high volume production.

Figure 5A:
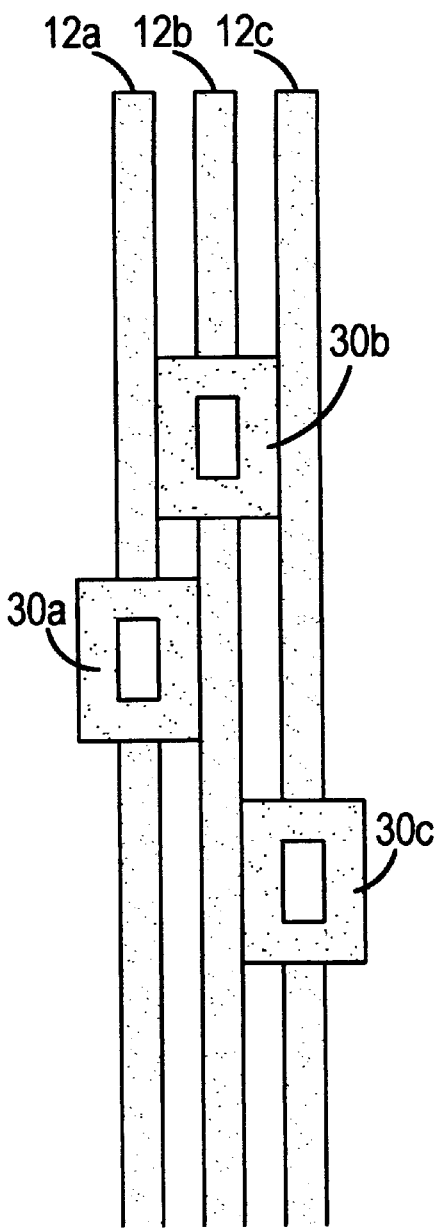
FIGS. 5A and 5B depict the method of manufacture of FIGS. 4A–4H in top view.
Figure 5B:
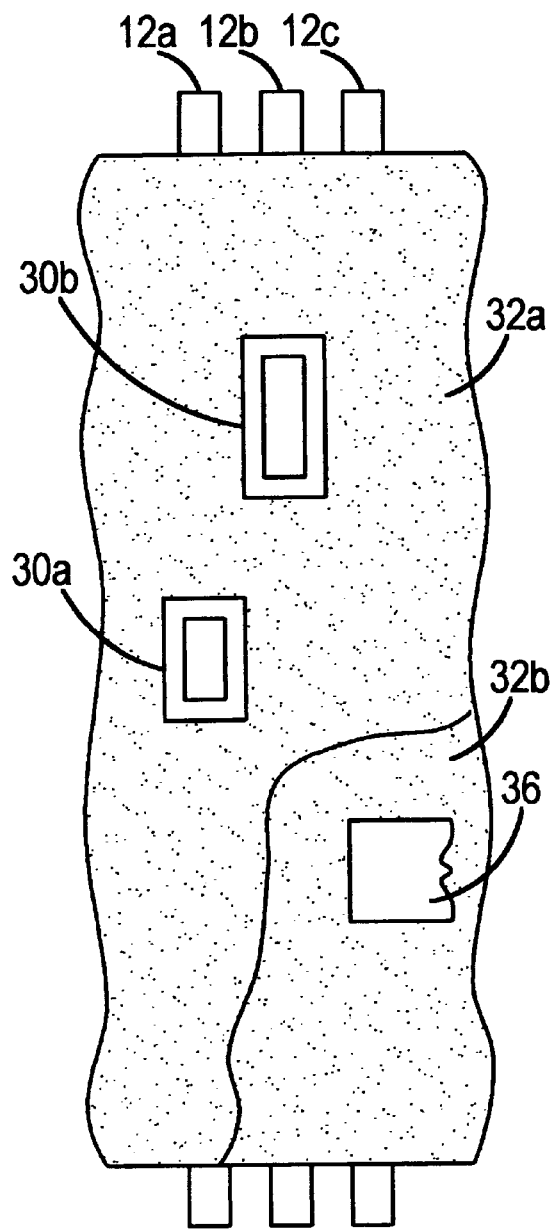

FIGS. 4A–4H and 5A–5B illustrate the method of this invention, as applied to the formation of vias. FIGS. 4A–4H depict a circuit in cross-section, while FIGS. 5A–5B depict top views of the circuit as applied to a series of parallel conductors. As seen in FIGS. 4B–4C and 5A, the formation of a via according to this invention involves an initial printing of a FDP in the form of a ring 30, which after drying, defines a dielectric-free region within the ring 30 in registry with a portion of the conductor 12. The FDP ring 30 is a relatively small feature, and is printed in a thin layer to provide good definition with only a small amount of dielectric spreading. In FIGS. 5A–5B, a series of three parallel conductors are designated as 12a–12c, and the corresponding FDP rings are designated as 30a–30c. In each case, the dried but un-fired FDP ring 30 defines a thin ring of porous dielectric material surrounding the intended location of the via.

A first cover layer 32a of dielectric then printed on the substrate 10, partially overlapping the dried FDP ring 30, as shown in FIGS. 4D and 5B. Due to its porosity, the FDP ring 30 acts like a sponge, absorbing the liquid medium in the freshly printed cover layer 32a. This quickly dries the edges of the cover layer 32 which overlap FDP ring 30, and substantially inhibits spreading of the dielectric material beyond its original print boundary; this can be seen in FIG. 4E, which depicts the circuit after drying. The drying action of the porous FDP layer permits the use of a thicker cover layer 32a than could be used with prior art manufacturing techniques, as may be seen by comparison with FIGS. 2A–2F. The greater thickness of the dielectric print helps eliminate the formation of pin-holes in the resulting dielectric layer, and minimizes the number of successive dielectric layers needed to achieve the desired overall dielectric thickness.

After the cover layer 32a has been dried, it and the FDP ring 30 are co-fired, as depicted in FIG. 4F. Then, a second dielectric cover layer 32b may be printed atop cover layer 32a to achieve the desired overall dielectric thickness. As indicated in FIG. 4G and in the lower right-hand corner of FIG. 5B, the print via of the second dielectric cover layer 32b is preferably enlarged relative to cover layer 32a to accommodate for dielectric spreading, as the fired FDP ring 30 is no longer porous, and is therefore incapable of inhibiting spreading of the dielectric layer 32b. In certain instances, the thickness of dielectric layer 32b, and thus the amount of spreading, may be reduced compared to prior art manufacturing approaches due to the increased thickness of cover layer 32a. FIG. 4H depicts the circuit after drying and spreading of the dielectric layer 32b, and indicates a completed via width of approximately 7 mils.

As demonstrated above, the manufacturing method of this invention can be used to achieve increased dielectric thickness, while at the same time, improving feature definition. In a first respect, the definition is improved because the dielectric of cover layer 32a is prevented from spreading beyond the edge of the relatively well-defined FDP ring 30, and in a second respect, the definition is improved because the overall width of the resulting via, about 11 mils, is reduced compared with the process depicted in FIG. 2.

The purpose of a via, of course, is to provide a connection point between conductors on different circuit layers. Thus, FIG. 5B illustrates a via connection between conductor 12, and a second conductor 36 formed on the dielectric cover layer 32b. Typically, an intervening metal fill layer (not shown) is printed to fill the via with conductive material, ensuring a good electrical connection between the conductors 12 and 36.

Figure 6A:
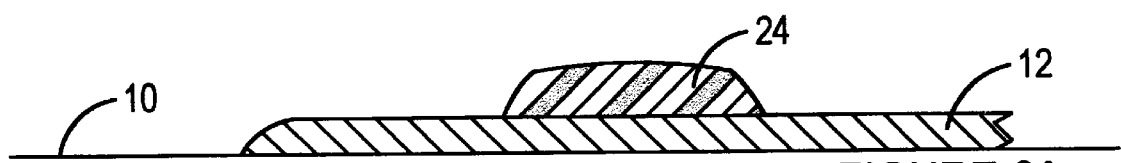
FIGS. 6A, 6B 6C and 6D depict in cross-section a method of manufacturing a solder stop in a thick film circuit according to this invention.
Figure 6B:
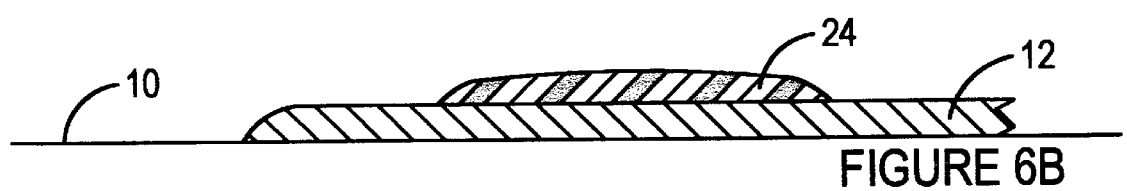
Figure 6C:
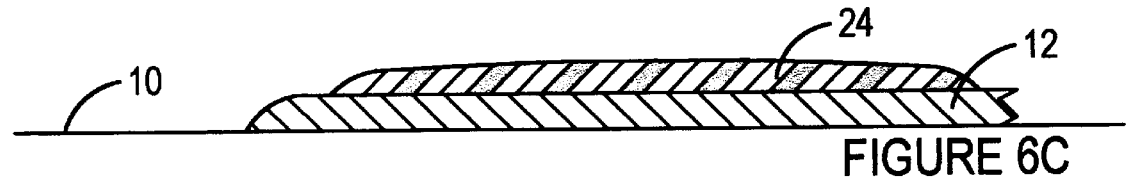
Figure 6D:
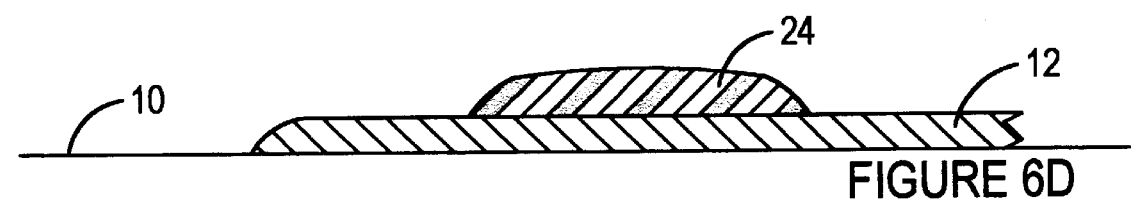

FIGS. 6A–6D illustrate the process variability improvement when the feature definition print is extended to include the formation of solder-stops 24. When the solder stops are formed as part of the FDP, the print layer is significantly thinner than in conventional processes, as seen in FIG. 6A. As a result, the dielectric spreading variability is significantly decreased, as illustrated in FIGS. 6B–6D. As in FIG. 3, FIG. 6B–6D respectively depict nominal spreading, higher than nominal spreading, and lower than nominal spreading. Only in this case, the spreading variability is reduced to the point where normal solder joints may be formed in each of the illustrated conditions, resulting in high solder joint strength and proper stand-off height of the component 20.

In summary, the method of this invention significantly improves the formation of dielectric isolation layers and feature definition in multi-layer thick-film circuits. The use of a thin feature definition print not only improves feature definition, and therefore process repeatability, but at the same time, it also allows the formation of a thicker dielectric layer. Although described in reference to the illustrated embodiments, it is expected that various modifications will occur to those skilled in the art. For example, the disclosed method can be used on any layer of a multi-layer circuit, and can be applied to features other than vias and solder-stops. Additionally, various steps may be added or combined in ways well known to those skilled in the art. In this regard, it will be understood that the scope of this invention is not limited to the illustrated embodiments and that methods incorporating such modifications may fall within the scope of this invention, which is defined by the appended claims.

The embodiments of the invention in which an exclusive property or privilege is claimed are defined as follows:

1. A method of manufacturing a multi-layer circuit, comprising the steps of:

printing, drying and firing a first conductor, forming a portion of a first circuit layer;

forming a feature definition layer of porous dielectric material on a border portion of said conductor adjacent an intended connection region of said conductor by printing and drying a layer of dielectric material on said border portion;

printing a first cover layer of dielectric material on said first circuit layer and at least partially overlapping said feature definition layer, said feature definition layer inhibiting spreading of said first cover layer of dielectric material onto said intended connection region of said conductor prior to and during drying of said cover layer; and co-firing said feature definition layer and first cover layer.

2. The method of claim 1, including the step of:

printing, drying and firing a second cover layer of dielectric material atop said first cover layer.

3. The method of claim 2, including the step of printing a second conductor on said second cover layer of dielectric material, said second conductor intersecting said intended connection region of said first conductor, and forming a portion of a second circuit layer; and forming an electrical connection between said first and second conductors at said intended connection region of said first conductor.

4. A method of manufacturing a multi-layer circuit, comprising the steps of:

printing, drying and firing a first conductor, forming a portion of a first circuit layer;

printing and drying a closed ring of dielectric material on said first circuit layer, said ring of dielectric material defining a dielectric-free region within said ring in registry with a pre-defined portion of said first conductor, thereby to form a layer of porous dielectric material surrounding said pre-defined portion of said first conductor;

printing a cover layer of dielectric material covering said first circuit layer and at least partially overlapping said layer of porous dielectric material, said layer of porous dielectric material inhibiting spreading of said cover layer of dielectric material onto said pre-defined portion of said first conductor; and drying and co-firing said closed ring and cover layer of dielectric material.

5. The method of claim 4, including the step of:

printing, drying and firing a second cover layer of dielectric material atop said first cover layer.

6. The method of claim 5, including the step of printing a second conductor on said second cover layer of dielectric material, said second conductor intersecting said pre-defined portion of said first conductor, and forming a portion of a second circuit layer; and forming an electrical connection between said first and second conductors at said pre-defined portion of said first conductor.

7. The method of claim 4, wherein said first circuit layer includes a further conductor having an end portion adapted to serve as a solder connection site for a component of said first circuit layer, said method including the step of:

forming a feature definition layer of porous dielectric material on a border portion of said further conductor adjacent said end portion by printing, drying and firing a layer of dielectric material on said border portion, said feature definition layer serving to define a limit of said solder connection site.

8. The method of claim 7, wherein said closed ring of dielectric material and said feature definition layer are printed concurrently.

9. A method of forming a layer of dielectric material over a circuit, the dielectric material including a via for accessing a first conductor of said circuit, the method comprising the steps of:

printing and drying a closed ring of dielectric material on said circuit, said ring of dielectric material defining a dielectric-free region within said ring in registry with a designated portion of said first conductor, thereby to form a layer of porous dielectric material surrounding said designated conductor portion;

printing a first cover layer of dielectric material covering said first circuit layer and at least partially overlapping said layer of porous dielectric material, said layer of porous dielectric material inhibiting spreading of said first cover layer of dielectric material onto said designated conductor portion; and drying said first cover layer of dielectric material and co-firing said porous dielectric material and the dried first cover layer of dielectric material.

10. The method of claim 9, including the step of:

printing, drying and firing a second cover layer of dielectric material atop said first cover layer.

11. The method of claim 10, including the step of printing a second conductor on said second cover layer of dielectric material, said second conductor intersecting said designated portion of said first conductor; and forming an electrical connection between said first and second conductors at said designated portion of said first conductor.

12. The method of claim 9, wherein said circuit includes a further conductor having an end portion adapted to serve as a solder connection site for a component of said circuit, said method including the step of:

forming a feature definition layer of porous dielectric material on a border portion of said further conductor adjacent said end portion by printing, drying and firing a layer of dielectric material on said border portion, said feature definition layer serving to define a limit of said solder connection site.

13. The method of claim 12, wherein said closed ring of dielectric material and said feature definition layer are printed concurrently.

* * * * *